United States Patent [19]

Takemura et al.

[11] Patent Number: 5,728,508
[45] Date of Patent: Mar. 17, 1998

[54] METHOD OF FORMING RESIST PATTERN UTILIZING FLUORINATED RESIN ANTIREFLECTIVE FILM LAYER

[75] Inventors: Katsuya Takemura; Toshinobu Ishihara; Satoshi Watanabe; Kazumasa Maruyama, all of Nakakubiki-gun; Hirofumi Kishita; Kouichi Yamaguchi, both of Usui-gun, all of Japan

[73] Assignee: Shin-Etsu Chemical Co., Ltd., Tokyo, Japan

[21] Appl. No.: 672,961

[22] Filed: Jul. 1, 1996

Related U.S. Application Data

[63] Continuation-in-part of Ser. No. 403,411, Mar. 13, 1995, abandoned.

[30] Foreign Application Priority Data

Mar. 14, 1994 [JP] Japan .................................. 6-069050

[51] Int. Cl.$^6$ .................................................. G03C 1/835
[52] U.S. Cl. .......................... 430/315; 430/512; 430/514
[58] Field of Search .................................. 428/421, 447,
428/500, 522; 526/242, 245, 246, 279,
332; 528/10, 401; 430/313, 315, 510, 512,
513, 514, 311

[56] References Cited

U.S. PATENT DOCUMENTS

| 5,246,767 | 9/1993 | Agou et al. ....................... 428/212 |
| 5,284,902 | 2/1994 | Huber et al. ...................... 524/544 |
| 5,392,156 | 2/1995 | Kumagai et al. .................. 359/586 |

FOREIGN PATENT DOCUMENTS 62-62520  3/1987  Japan .

*Primary Examiner*—Christopher G. Young
*Attorney, Agent, or Firm*—Millen, White, Zelano, & Branigan, P.C.

[57] ABSTRACT

A method of forming a resist pattern comprising forming a photoresist layer on a substrate, forming a transparent anti-reflective film on said photoresist layer by applying an anti-reflective material onto said photoresist layer, said anti-reflective material comprising a fluorinated resin which is soluble in an organic hydrocarbon solvent, exposing a light to said resist layer through said transparent anti-reflective film, removing said anti-reflective film using an organic hydrocarbon solvent, and developing said photoresist layer.

9 Claims, 2 Drawing Sheets

METHOD OF FORMING RESIST PATTERN UTILIZING FLUORINATED RESIN ANTIREFLECTIVE FILM LAYER

CROSS REFERENCE TO RELATED APPLICATION

This application is a continuation-in-part of application Ser. No. 08/403,411 filed on Mar. 13, 1995, now abandoned, the entire contents of which are hereby incorporated by reference.

BACKGROUND OF THE INVENTION

1. Field of the Invention

This invention relates to an anti-reflective material for forming an anti-reflective film in the manufacture of semiconductor integrated circuits, especially on a photo-resist used in patterning by photo-lithography, for the purpose of preventing a lowering of pattern dimensional accuracy which is otherwise caused by the interference within the photoresist film between incident light and light reflected from a substrate, thereby enabling micro-processing.

2. Prior Art

As the LSI technology tends toward higher integration and higher speed, further refinement of pattern rules is required. The patterning technology mostly relies on light exposure which is now approaching the essential limit of resolution which is dictated by the wavelength of a light source. It is generally recognized that in light exposure using g-line (wavelength 436 nm) or i-line (wavelength 365 nm) as a light source, a pattern rule of about 0.5 µm is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Under such circumstances, deep-ultraviolet lithography is regarded promising as the next generation of fine patterning technology. The deep-UV lithography is capable of working on the order of 0.3 to 0.4 µm. If a less light absorbing resist is used, there can be formed a pattern having a side wall nearly perpendicular to the substrate. Because of possible overall pattern transfer, it is more advantageous in throughput than electron beam lithography. Great attention is now paid to the technique of utilizing a high illuminance KrF excimer laser as a deep-UV light source.

However, the use of deep-ultraviolet light, especially monochromatic light as emitted from a KrF excimer laser has the problem that since silicon or another material as the substrate material has a high reflectivity interference occurs in a highly transparent photoresist between incident light and light reflected from the substrate. This interference causes a change of pattern size pursuant to the resist film thickness, resulting in a lowering of pattern size precision. Especially when the substrate has an irregular surface, the photoresist layer largely changes its thickness at steps to induce optical interference. As a result, the resist image becomes low in dimensional accuracy, failing to process a pattern to an accurate size. Also the dimensional accuracy of alignment marks for successive exposure is reduced, leading to a low alignment accuracy.

Several patterning techniques were proposed as having solved the above-mentioned problems associated with substrate surface irregularities, for example, a multi-layer resist technique as disclosed in Japanese Patent Application Kokai (JP-A) No. 10775/1976, an ARC technique (anti-reflective coating beneath resist) as disclosed in JP-A 93448/1984 (U.S. Pat. No. 4,910,122), and an ARCOR technique (anti-reflective coating on resist) as disclosed in JP-A 62520/1987 and 62521/1987. The multi-layer technique involves forming two or three layers of resist and transferring a pattern to form a resist pattern serving as a mask. Undesirably the multi-layer technique requires a number of steps and is low in production efficiency. Light reflection from an intermediate layer can cause a lowering of dimensional accuracy. The ARC technique is by etching an anti-reflective film formed beneath the resist layer. The dimensional accuracy is substantially lost by etching and the extra etching step lowers production efficiency.

In contrast, the ARCOR technique which involves forming a transparent anti-reflective film on a resist layer and peeling the film after exposure is able to form a fine resist pattern to high dimensional and alignment accuracy in a convenient way.

In JP-A 62520/1987, by using low refractive index materials, for example, perfluoroalkyl compounds (e.g., perfluoroalkyl polyethers and perfluoroalkylamines) as the anti-reflective film, the ARCOR technique minimizes reflection light at the resist layer/anti-reflective film interface, thereby reducing the change in pattern size of a resist image to about ⅓ as compared with a single resist layer. However, since the perfluoroalkyl compounds are less soluble in organic solvents, they must be diluted with fluorinated diluents such as Freon solvents in order to control the thickness of a coating film. When it is desired to remove anti-reflective films of the perfluoroalkyl compounds, Freon solvents are again used as a remover. Although Freon solvents have the advantage that it causes no intermixing with the underlying resist layer, the use of Freon is now considered undesirable from the standpoint of environmental protection. Another problem is an increased number of steps. Additionally, Freon solvents are very expensive and uneconomical from an industrial aspect.

In JP-A 62521/1987, a water-soluble polysaccharide is used to form an anti-reflective film, which induces no intermixing at the resist/anti-reflective film interface and which can be removed at the same time as a developing step. This process is convenient. However, since the polysaccharide has a lower refractive index than the perfluoroalkyl compounds, this process reduces the change in pattern size of a resist image to only about ⅔ as compared with a single resist layer.

SUMMARY OF THE INVENTION

Therefore, an object of the present invention is to provide a method of forming a resist pattern according to the ARCOR technique by using an inexpensive, environmentally safe anti-reflective material which forms an anti-reflective film which allows a fine resist pattern to be defined to a high dimensional accuracy and alignment accuracy in an easy, efficient, reproducible manner.

We have found that fluorinated resins which are easily soluble in organic solvents other than Freon, especially relatively low polar hydrocarbon organic solvents such as toluene, xylene, hexane, octane, and decalin, and have a low refractive index, more specifically up to 1.45 at a wavelength of 633 nm are useful as anti-reflective materials. By forming an anti-reflective film on a resist layer from such a material, reflected light at the resist layer surface can be reduced without a loss of incident light and a change of pattern size due to optical multiple interference in the resist layer can be reduced to about ½ as compared with a single resist layer. Preferably the fluorinated resin is a polysiloxane having a side chain fluorine-modified siloxane structure represented by the following general formula (1):

wherein $R^1$ is an aliphatic or aromatic, unsubstituted or halo-, amino-, nitro-, hydroxy- or cyano-substituted, monovalent hydrocarbon group, $R^2$ is a divalent organic group, and $R^3$ is a perfluoroalkyl or perfluoroalkyl ether group having 4 to 20 carbon atoms; or a copolymer having a side chain fluorine-modified alkyl acryl structure represented by the following general formula (2):

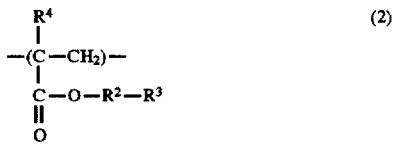

wherein $R^2$ is a divalent organic group, $R^3$ is a perfluoroalkyl or perfluoroalkyl ether group having 4 to 20 carbon atoms, and $R^4$ is a methyl group or hydrogen atom; or a perfluoroethylene-vinyl ether copolymer represented by the following general formula (3):

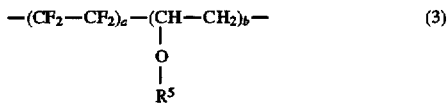

wherein $R^5$ is an unsubstituted or halo-, amino-, nitro-, hydroxy- or cyano-substituted aromatic group or an alkyl group having 1 to 20 carbon atoms, and letters a and b are numbers satisfying $0.1 \leq a/(a+b) \leq 0.9$.

More particularly, when a polysiloxane having a side chain fluorine-modified siloxane structure of formula (1) is used to form an anti-reflective film, the film has a low refractive index of about 1.40. When a copolymer having a side chain fluorine-modified alkyl acryl structure of formula (2) and a perfluoroethylene-vinyl ether copolymer of formula (3) are used to form anti-reflective films, the films have a low refractive index of about 1.44 (both). When these resin films are used as a layer on top of a resist layer, optical reflectivity can be significantly reduced to improve the dimensional accuracy of a resist image and a change of pattern size caused by optical multiple interference in the resist layer can be reduced to about ½ as compared with the use of a resist layer alone. Since the fluorinated resins of formulae (1), (2) and (3) are easily soluble in organic solvents other than Freon, including relatively low polar hydrocarbon organic solvents such as toluene, xylene, hexane, octane, and decalin, anti-reflective films can be formed with ease. Removal of anti-reflective films can also be easily and completely effected using these organic solvents. No intermixing occurs at the resist/anti-reflective film interface. Use of these fluorinated resins invites no problem in a process aspect and is safe to the environment.

Briefly stated, the present invention provides a method of forming a resist pattern comprising forming a photoresist layer on a substrate, forming a transparent anti-reflective film on said photoresist layer by applying an anti-reflective material onto said photoresist layer, said anti-reflective material comprising a fluorinated resin which is soluble in an organic hydrocarbon solvent, exposing a light to said resist layer through said transparent anti-reflective film, removing said anti-reflective film using an organic hydrocarbon solvent, and developing said photoresist layer.

DETAILED DESCRIPTION OF THE INVENTION

Figure 1A:
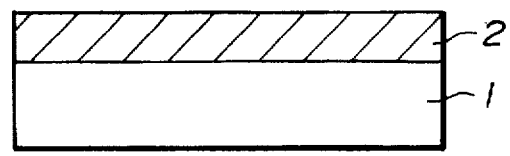
FIG. 1 illustrates a typical lithographic process.

According to the present invention, a resist pattern is formed in the ARCOR technique by using an anti-reflective material to form a transparent anti-reflective film on a photoresist layer. After exposure of the photoresist layer, the anti-reflective film is removed with an organic hydrocarbon solvent.

A major component of the anti-reflective film-forming material or composition of the invention is a fluorinated resin which is soluble in an organic hydrocarbon solvent. Any fluorinated resins can be used so long as they are soluble in an organic hydrocarbon solvent such as toluene, xylene, ethylbenzene, hexane, octane, decalin, methyl chloride and the like. In one preferred embodiment, the fluorinated resin is a polysiloxane containing a side chain fluorine-modified siloxane unit of the following general formula (1):

wherein $R^1$ is an aliphatic or aromatic, unsubstituted or halo-, amino-, nitro-, hydroxy- or cyano-substituted, monovalent hydrocarbon group, $R^2$ is a divalent organic group, and $R^3$ is a perfluoroalkyl or perfluoroalkyl ether group having 4 to 20 carbon atoms.

Preferably, the monovalent hydrocarbon group represented by $R^1$ is one having 1 to 12 carbon atoms, preferably 1 to 8 carbon atoms, for example, alkyl groups such as methyl, ethyl, propyl, butyl, hexyl, cyclohexyl and octyl groups; alkenyl groups such as vinyl, allyl, propenyl and butenyl groups; aryl groups such as phenyl and tolyl groups; aralkyl groups such as benzyl and phenylethyl groups; and substituted ones thereof in which some or all of the hydrogen atoms attached to carbon atoms are replaced by halogen atoms (e.g., chlorine and fluorine), amino, nitro, hydroxy, cyano and other groups.

$R^2$ is a divalent organic group separating the fluorinated organic group $R^3$ from the silicon atom, for example, a divalent hydrocarbon group free of an aliphatic unsaturated bond such as an alkylene group and a divalent organic group having an ether bond or ester bond represented by the following general formula (4) or (5):

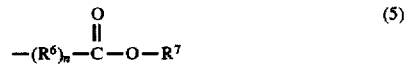

wherein each of $R^6$ and $R^7$ is a divalent organic group free of an aliphatic unsaturated bond such as alkylene group.

Letter n is 0 or 1. The organic groups represented by $R^2$ preferably have 1 to 12 carbon atoms, especially 1 to 8 carbon atoms. Preferred examples are —$CH_2CH_2$—, —$CH_2CH_2CH_2$—, —$CH_2CH_2CH_2$—O—$CH_2$—, and —COO—$CH_2CH_2CH_2$—.

$R^3$ is a perfluoroalkyl group or a perfluoroalkyl ether group. The perfluoroalkyl groups are typically those represented by —$C_pF_{2p+1}$ wherein p is an integer of 4 to 20, preferably —$C_4F_9$, —$C_8F_{17}$, and —$C_{10}F_{21}$. The perfluoroalkyl ether groups are preferably those having 5 to 20 carbon atoms, with preferred examples shown below.

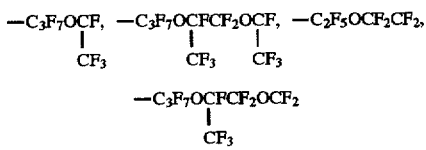

In addition to the unit of formula (1), the polysiloxane should preferably contain one or more of a $R_2^8SiO$ unit, $R^8HSiO$ unit, $R^8SiO_{3/2}$ unit, $SiO_{4/2}$ unit, and $R_3^8SiO_{1/2}$ unit wherein $R^8$ is an unsubstituted or halo-, amino-, nitro-, hydroxy- or cyano- substituted monovalent hydrocarbon group preferably having 1 to 10 carbon atoms such as unsubstituted or halo-, amino-, nitro-, hydroxy- or cyano- substituted $C_{1-10}$ alkyl or $C_{6-10}$ aryl group.

The side chain fluorine-modified siloxane unit of formula (1) should preferably be contained in the polysiloxane in an amount of 0.1 to 5 mol %, especially 0.1 to 4 mol % of the entire siloxane units. If the content of the side chain fluorine-modified siloxane unit is less than 0.1 mol %, a film with a low refractive index would not be formed. Contents of more than 5 mol % would detract from solubility in organic hydrocarbon solvents.

Also preferred as the fluorinated resin is a copolymer having a side chain fluorine-modified alkyl acryl structure of the following general formula (2):

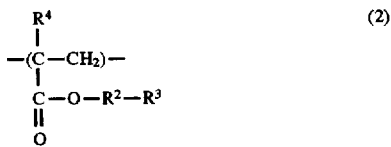

wherein $R^2$ is a divalent organic group, $R^3$ is a perfluoroalkyl or perfluoroalkyl ether group having 4 to 20 carbon atoms, and $R^4$ is a methyl group or hydrogen atom. Examples of the groups represented by $R^2$ and $R^3$ are the same as described for formula (1).

More particularly, the copolymer may consist essentially of the side chain fluorine-modified alkyl acryl unit of formula (2) and a unit copolymerizable therewith. The copolymerizable unit may be any desired unit as long as it is copolymerized with the unit of formula (2), with preferred examples thereof shown below.

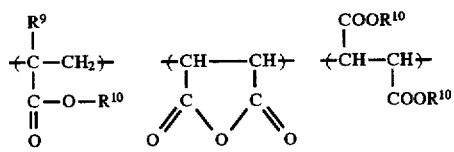

In these formulae, $R^9$ is a methyl group or hydrogen atom, and $R^{10}$ is an unsubstituted or halo-, amino-, nitro-, hydroxy- or cyano- substituted monovalent hydrocarbon group preferably having 1 to 20 carbon atoms such as unsubstituted or halo-, amino-, nitro-, hydroxy- or cyano-substituted $C_{1-20}$ alkyl or $C_{6-20}$ aryl group.

The proportion of the side chain fluorine-modified alkyl acrylate unit of formula (2) copolymerized is preferably 10 to 90 mol %, especially 30 to 60 mol %. Copolymers having a lower proportion of the formula (2) unit would not form a low refractive index film whereas copolymers having a higher proportion of the formula (2) unit would be less soluble in hydrocarbon solvents.

The copolymers having a side chain fluorine-modified alkyl acryl structure of formula (2) can be readily prepared by copolymerizing perfluoroalkyl acrylates or perfluoroalkyl methacrylates with acrylates or methacrylates having various alkyl groups. In this process, the perfluoro monomer may be copolymerized with one or more (meth)acrylate monomers.

Further preferred as the fluorinated resin is a perfluoroethylene-vinyl ether copolymer of the following general formula (3).

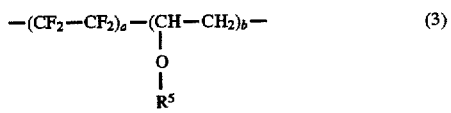

$R^5$ is an unsubstituted or halo-, amino-, nitro-, hydroxy- or cyano-substituted aromatic group or an alkyl group having 1 to 20 carbon atoms, for example, aryl groups such as phenyl and tolyl groups, aryl groups having a hydroxyl, halogen atom (chlorine or fluorine), amino group, nitro group, cyano group or the like, normal alkyl groups such as methyl, ethyl, n-butyl and n-hexyl groups, branched alkyl groups such as isopropyl and isobutyl groups, cyclic alkyl groups such as cyclohexyl, and alkyl groups having a hydroxyl group, halogen atom (chlorine or fluorine), amino group, nitro group, cyano group or the like.

Letters a and b are numbers such that a/(a+b) ranges from 0.1 to 0.9, preferably 0.3 to 0.6. Copolymers with a below the range would be difficult to form a low refractive index film whereas copolymers with a beyond the range would be less soluble in hydrocarbon solvents.

The perfluoroethylene-vinyl ether copolymers of formula (3) can be readily prepared by copolymerizing tetrafluoroethylene with various alkyl vinyl ethers. In this process, tetrafluoroethylene may be copolymerized with one or more vinyl ethers.

All these preferred fluorinated resins have a refractive index of up to 1.45 at a wavelength of 633 nm.

The fluorinated resins including the polysiloxane containing at least a side chain fluorine-modified siloxane unit of formula (1), the copolymer having a side chain fluorine-modified alkyl acryl unit of formula (2) and the perfluoroethylene-vinyl ether copolymer of formula (3) may preferably have a weight average molecular weight of 3,000 to 100,000, more preferably 5,000 to 30,000.

The fluorinated resins are preferably used by dissolving them in relatively less polar organic solvents. Any desired solvent may be used insofar as the fluorinated resin is soluble therein. Since the resulting composition is applied onto a resist film, the solvent which attacks or dissolves the resist film should be avoided. Exemplar solvents are relatively less polar hydrocarbon solvents such as toluene, xylene, ethylbenzene, hexane, octane, decalin, and methylene chloride. In this regard, we have examined the detail of the organic hydrocarbon solvents in which the fluorinated resins can be dissolved and in which resist films are not dissolved at all, finding that organic solvents having a solubility parameter of up to 9.5, preferably from 7.0 to 9.0, more preferably from 8.0 to 9.0 are preferred. Those organic solvents having a solubility parameter of more than 9.5 can dissolve the base polymer of resist films.

Preferably the fluorinated resins are dissolved in such organic solvents in concentrations of about 1 to 50% by weight, especially about 1 to 40% by weight. Solutions having higher concentrations would be too viscous to form films whereas films formed from solutions having lower concentrations would fail as an anti-reflective film.

To the anti-reflective material, surfactants are preferably added for improving film formability. Exemplary surfactants are betaine-type surfactants, amine oxide surfactants, amine carboxylate surfactants, polyoxyethylene alkyl ether surfactants, and fluorinated ones of these surfactants. The surfactant is preferably added in an amount of 0 to 2%, especially 0 to 1% by weight based on a fluorinated resin/organic solvent system.

Figure 1B:
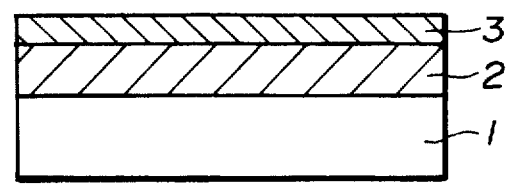
Figure 1C:
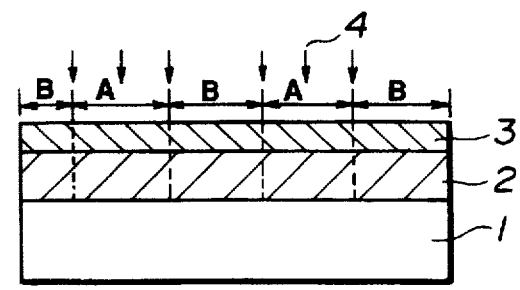
Figure 1D:
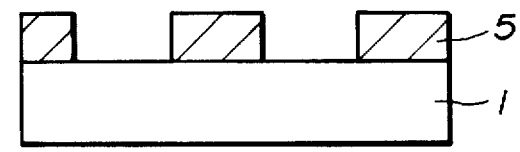

Any desired well-known technique may be used in forming a resist pattern using the anti-reflective material according to the present invention. For example, a typical lithographic process is shown in FIG. 1. First a photoresist layer 2 is formed on a substrate 1 such as a silicon wafer by a suitable technique such as spin coating as shown in FIG. 1(a). The anti-reflective material according to the invention is applied onto the photoresist layer 2 as by spin coating, forming an anti-reflective layer 3 as shown in FIG. 1(b). The photoresist layer 2 is exposed through the anti-reflective layer 3 to a desired pattern of ultraviolet radiation or excimer laser light 4 having a wavelength of 190 to 500 nm by a demagnification projection technique. That is, regions A of the anti-reflective layer 3 and photoresist layer 2 are illuminated as shown in FIG. 1(c). Thereafter, the anti-reflective layer 3 is removed using an organic hydrocarbon solvent. The organic hydrocarbon solvent includes the same ones as described above such as toluene, xylene, hexane, octane, and decalin. The photoresist layer 2 is developed with a conventional developer, obtaining a resist pattern 5 as shown in FIG. 1(d).

The anti-reflective layer 3 preferably has a thickness of 300 to 2,000 Å, especially a thickness of about 420 Å or 1,270 Å when exposure is made with light of 248 nm.

Since a positive resist is used as the photoresist layer 2 in the embodiment of FIG. 1, regions B are left as a resist pattern. The photoresist used herein may be either positive or negative type insofar as it has a contrast threshold value of a desired level relative to light of a given wavelength.

Figure 2:
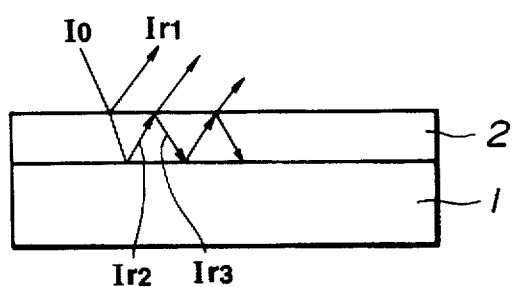
FIG. 2 shows light scattering associated with a resist layer formed on a substrate.
Figure 3:
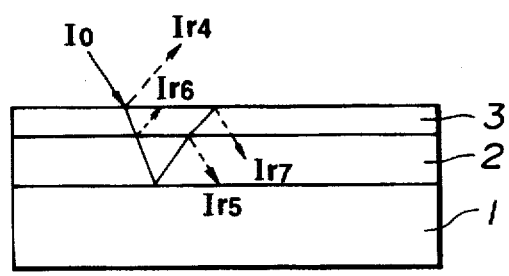
FIG. 3 shows light scattering associated with an anti-reflective film and a resist layer on a substrate.

Referring to FIGS. 2 and 3, it is described how an anti-reflective film made of the anti-reflective material according to the invention reduces optical scattering. FIG. 2 shows a prior art structure in which only a resist layer 2 is formed on a substrate 1. Incident light $I_0$ reaching the resist layer 2 undergoes substantial reflection $I_1$ at the air-resist layer interface with a substantial portion of the incident light quantity being lost. The light entering the resist layer 2 undergoes reflection $I_{r2}$ at the resist layer-substrate interface whereupon the reflected light $I_{r2}$ goes out of the resist layer 2 as emergent light $I_{r1}$ while it is reflected $I_{r3}$ again at the resist layer-air interface. This process is repeated in the resist layer. That is, optical multiple interference occurs in the resist layer 2.

FIG. 3 shows a structure in which an anti-reflective film 3 according to the invention is formed on a resist layer 2 on a substrate 1. The provision of the anti-reflective film 3 is effective for reducing reflection $I_{r4}$ of incident light $I_0$ at the air-anti-reflective film interface and reflection $I_{r5}$ at the anti-reflective film-resist layer interface. Since $I_{r4}$ and $I_{r5}$ are reduced, the loss of incident light quantity is reduced. Since reflection $I_{r6}$ of the reflected light at the resist layer-anti-reflective film interface and reflection $I_{r7}$ of the reflected light at the anti-reflective film-air interface are opposite in phase, they offset each other, suppressing optical multiple interference in the resist layer 2.

According to the principle of reflection prevention, provided that the resist has an index of refraction n to illuminating light and the illuminating light has a wavelength λ, the reflectivity (amplitude ratio) of an anti-reflective film is reduced as the index of refraction n' of the anti-reflective film approaches to $\sqrt{n}$ and the thickness thereof approaches to an odd multiple of λ/4n'. In one example, a phenol-novolak material having an index of refraction of about 1.63 is used as the resist material, an anti-reflective film according to the invention has an index of refraction of about 1.43, and the light used is i-ray having a wavelength of 365 nm. Then the optimum thickness of the anti-reflective film is about 630 Å and about 1,890 Å. Under these conditions, the use of the anti-reflective film according to the invention is effective for reducing the reflected light and suppressing the optical multiple interference.

In another example, a polyhydroxystyrene material having a refractive index of about 1.56 is used as the resist material, an anti-reflective film according to the invention has an index of refraction of about 1.46, and the light used is KrF excimer laser light having a wavelength of 248 nm. Then the optimum thickness of the anti-reflective film is about 430 Å and about 1,270 Å. Under these conditions, the use of the anti-reflective film according to the invention is effective for reducing the reflected light and suppressing the optical multiple interference.

EXAMPLE

Examples of the invention are given below by way of illustration and not by way of limitation.

Example 1

Using an anti-reflective composition, a resist pattern was formed according to a lithographic process as shown in FIG. 1. The composition used herein was a 3.5% xylene solution of a side chain fluorine-modified siloxane resin in the form of a methylheptadecafluorodecylsiloxane (3.7 mol %)/dimethylsiloxane (96.3 mol %) copolymer.

First, a positive resist THMR-iP2000 (manufactured by Tokyo Oka-Kogyo K.K.) was spin coated on a substrate 1 in the form of a silicon wafer and pre-backed at 90° C. for 90 seconds to form a resist layer 2 (FIG. 1(a)). Then the anti-reflective composition was spin coated on the resist layer 2 to form an anti-reflective layer 3 to a thickness of 630 Å or 1,890 Å (FIG. 1(b)). Regions A were selectively exposed to UV light 4 of 365 nm by a demagnification projection technique (FIG. 1(c)). Thereafter, the anti-reflective layer 3 was removed with xylene. Development was effected with an alkaline developer to form a resist pattern 5 (FIG. 1(d)). No intermixing occurred at the resist/anti-reflective layer interface. The resulting resist pattern had a change of pattern size reduced to about ±500 Å as compared with the single photoresist layer lithography entailing a change of ±1000 Å.

Example 2

Using an anti-reflective composition, a resist pattern was formed according to a lithographic process as shown in FIG. 1. The composition used herein was a 3.5% xylene solution of a side chain fluorine-modified siloxane resin in the form of a methylheptadecafluorodecylsiloxane (3.7 mol %)/diethylsiloxane (96.3 mol %) copolymer.

First, a chemical amplification type positive resist was spin coated on a substrate 1 in the form of a silicon wafer and pre-baked at 100° C. for 120 seconds to form a resist layer 2 (FIG. 1(a)). Then the anti-reflective composition was spin coated on the resist layer 2 to form an anti-reflective layer 3 to a thickness of 430 Å or 1,290 Å (FIG. 1(b)). Regions A were selectively exposed to KrF excimer laser light 4 of 248 nm by a demagnification projection technique (FIG. 1(c)). Thereafter, the anti-reflective layer 3 was removed with xylene. Development was effected with an alkaline developer to form a resist pattern 5 (FIG. 1(d)). No intermixing occurred at the resist/anti-reflective layer interface. The resulting resist pattern had a change of pattern size reduced to about ±500 Å as compared with the single photoresist layer lithography entailing a change of ±1000 Å.

Examples 3 & 4

Resist patterns were formed as in Examples 1 and 2 except that a 3.5% xylene solution of a side chain fluorine-modified siloxane resin in the form of a methyl-pentafluoroethoxyoctafluorobutylsiloxane (3.5 mol %)/dimethylsiloxane (96.5 mol %) copolymer was used as the anti-reflective composition. Equivalent results were obtained.

Examples 5 & 6

Resist patterns were formed as in Examples 1 and 2 except that a 30.0% xylene solution of a side chain fluorine-modified alkyl acryl resin in the form of a heptadecafluorodecyl acrylate (41 mol %)/alkyl acrylate (59 mol %) copolymer was used as the anti-reflective composition. Equivalent results were obtained.

Examples 7 & 8

Resist patterns were formed as in Examples 1 and 2 except that a 30.0% xylene solution of a side chain fluorine-modified alkyl acryl resin in the form of a pentafluoroethoxyoctafluorobutyl acrylate (42 mol %)/alkyl acrylate (58 mol %) copolymer was used as the anti-reflective composition. Equivalent results were obtained.

Examples 9 & 10

Resist patterns were formed as in Examples 1 and 2 except that a 30.0% xylene solution of a fluorinated resin in the form of a perfluoroethylene-vinyl ether copolymer Lumiflon LF-200c (manufactured by Asahi Glass K.K.) was used as the anti-reflective composition. Equivalent results were obtained.

There has been described a fluorinated resin base composition capable of forming on a resist layer an anti-reflective film which is effective for reducing the reflected light at the resist layer surface without a loss of incident light and suppressing a change of pattern size due to optical multiple interference in the resist layer.

Japanese Patent Application No. 69050/1994 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A method of forming a resist pattern comprising forming a photoresist layer on a substrate, forming a transparent anti-reflective film on said photoresist layer by applying an anti-reflective material onto said photoresist layer, said anti-reflective material comprising a fluorinated resin which is soluble in an organic hydrocarbon solvent or methyl chloride and has a refractive index of up to 1.45 at a wavelength of 633 nm, exposing said resist layer to light through said transparent anti-reflective film, removing said anti-reflective film by dissolution in an organic hydrocarbon solvent or methyl chloride, and developing said photoresist layer, said fluorinated resin being at least one selected from the group consisting of (i) a polysiloxane comprising 0.1 to 5 mol % of a side chain fluorine-modified siloxane unit of the following general formula (1):

wherein $R^1$ is an aliphatic or aromatic, unsubstituted or halo-, amino-, nitro-, hydroxy- or cyano-substituted, monovalent hydrocarbon group, $R^2$ is a divalent organic group, and $R^3$ is a perfluoroalkyl or perfluoroalkyl ether group having 4 to 20 carbon atoms, and the remaining of one or more units selected from the group consisting of a $R^8{}_2$ SiO unit, $R^8$HSiO unit, $R^8$SiO$_{3/2}$ unit, SiO$_{4/2}$ unit and $R^8{}_3$SiO$_{1/2}$ unit wherein $R^8$ is an unsubstituted or halo-, amino, nitro-, hydroxy- or cyano-substituted monovalent hydrocarbon group, (ii) a copolymer comprising 10 to 90 mol % of a side chain fluorine-modified alkyl acryl unit of the following general formula (2):

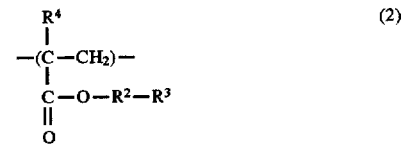

wherein $R^2$ is a divalent organic group, $R^3$ is a perfluoroalkyl or perfluoroalkyl ether group having 4 to 20 carbon atoms, and $R^4$ is a methyl group or hydrogen atom, and the remaining of a copolymerizable unit selected from the group consisting of the following units:

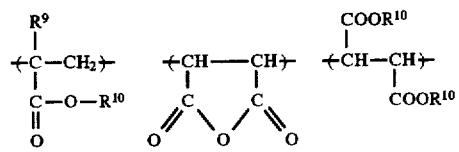

wherein $R^9$ is a methyl group or hydrogen atom and $R^{10}$ is an unsubstituted or halo-, amino-, nitro-, hydroxy- or cyano-substituted monovalent hydrocarbon group, and (iii) a perfluoroethylene-vinyl ether copolymer of the following general formula (3):

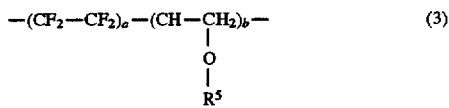

wherein $R^5$ is an unsubstituted or halo-, amino-, nitro-, hydroxy- or cyano-substituted aromatic group or an alkyl group having 1 to 20 carbon atoms, and letters a and b are numbers satisfying $0.1 \leq a/(a+b) \leq 0.9$.

2. The method of claim 1, wherein the organic hydrocarbon solvent is selected from the group consisting of toluene, xylene, ethylbenzene, hexane, octane, decalin and methyl chloride.

3. The method of claim 1, wherein the organic hydrocarbon solvent has a solubility parameter of up to 9.5.

4. The method of claim 1, wherein the fluorinated resin for the anti-reflective film is the polysiloxane (i) and the anti-reflective film has a refractive index of about 1.40.

5. The method of claim 1, wherein the fluorinated resin for the anti-reflective film is the copolymer (ii) or the perfluoroethylene-vinyl ether copolymer (iii) and the anti-reflective film has a refractive index of about 1.44.

6. The method of claim 1, wherein the monovalent hydrocarbon groups for $R^1$, $R^8$ and R are independently alkyl, alkenyl, phenyl, tolyl, benzyl or phenethyl groups of 1-12 carbon atoms optionally substituted by halogen atoms and/or amino, nitro, hydroxy or cyano groups;

the divalent organic groups for $R^2$ are independently alkylene groups of 1-12 carbon atoms optionally having an ether bond or ester bond in the chain;

the perfluoroalkyl or perfluoroalkyl ether groups for $R^3$ are independently —$C_p H_{2p+1}$ groups where p is 4–20 or groups of one of the following formulae:

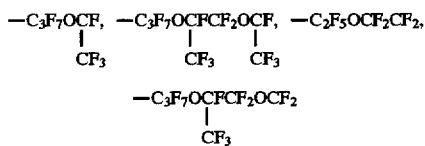

and $R^5$ is a phenyl or tolyl optionally substituted with hydroxy, halogen, amino, nitro or cyano groups, or a normal, branched or a cyclic alkyl group optionally substituted by hydroxy, halogen, amino, nitro or cyano groups.

7. The method of claim 1, wherein the fluorinated resin has a weight average molecular weight of 3,000 to 100,000.

8. The method of claim 1, wherein the organic hydrocarbon solvent has a solubility parameter of 7.0 to 9.0.

9. The method of claim 1, wherein the anti-reflective film has a thickness of 300 to 2000 Å.

* * * * *